United States Patent [19]

Fandrich et al.

[11] Patent Number: 5,430,677
[45] Date of Patent: Jul. 4, 1995

[54] ARCHITECTURE FOR READING INFORMATION FROM A MEMORY ARRAY

[75] Inventors: Mickey L. Fandrich, Placerville; Owen Jungroth, Sonora, both of Calif.

[73] Assignee: Intel Corporation, Santa Clara, Calif.

[21] Appl. No.: 239,939

[22] Filed: May 9, 1994

Related U.S. Application Data

[63] Continuation of Ser. No. 92,545, Jul. 16, 1993, abandoned, which is a continuation of Ser. No. 654,383, Feb. 11, 1991, abandoned.

[51] Int. Cl.[6] .............................................. G11C 7/00
[52] U.S. Cl. ................................. 365/189.02; 365/201
[58] Field of Search ..................... 365/189.02, 230.02, 365/201, 205; 328/137, 154

[56] References Cited

U.S. PATENT DOCUMENTS

| | | | |
|---|---|---|---|
| 4,636,987 | 1/1987 | Norwood et al. | 365/189.02 |
| 4,685,088 | 8/1987 | Iannucci . | |
| 4,691,300 | 9/1987 | Pelley, III et al. | 365/200 |
| 4,807,191 | 2/1989 | Flannagan | 365/230.03 |
| 4,951,252 | 8/1990 | White et al. | 365/205 |
| 5,046,047 | 9/1991 | Cliff et al. | 365/201 |
| 5,083,295 | 1/1992 | Lammerts et al. | 365/205 |
| 5,185,720 | 2/1993 | Vaillancourt et al. | 365/189.02 |

Primary Examiner—Timothy P. Callahan
Assistant Examiner—Toan Tran
Attorney, Agent, or Firm—Blakely, Sokoloff, Taylor & Zafman

[57] ABSTRACT

In a memory array having a plurality of rows and columns of memory devices for storing binary conditions, apparatus for selecting particular memory devices, a sense amplifier for transferring indications of the conditions of selected memory devices, and apparatus for generating signals indicative of conditions other than the state of the memory devices, the improvement including a multiplexor, the multiplexor being arranged to accept as input the output of the sense amplifier and the signals indicative of conditions other than the state of the memory devices, the multiplexor and the apparatus for generating signals indicative of conditions other than the state of the memory devices being positioned in a manner that parasitic capacitance affecting the input to the sense amplifier is not created. The output of the sense amplifier may also be connected to other internal circuits so that the memory array may be accessed while bringing other signals to the output pins.

4 Claims, 1 Drawing Sheet

FIG_1 (PRIOR ART)
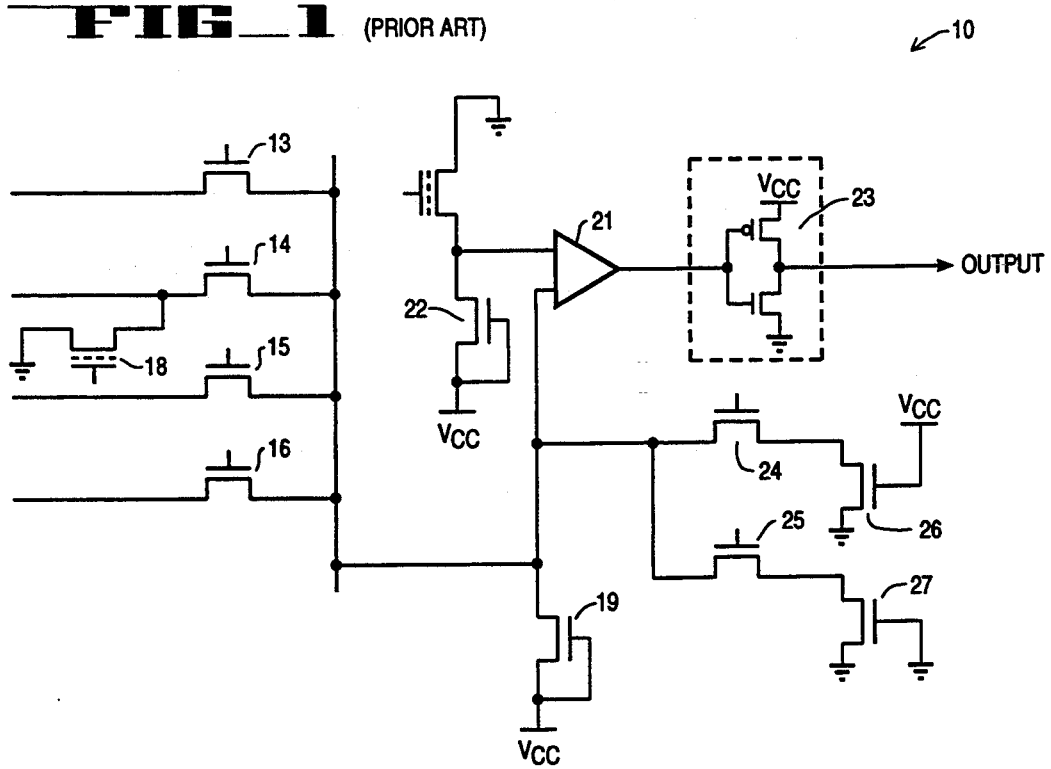
FIG_2
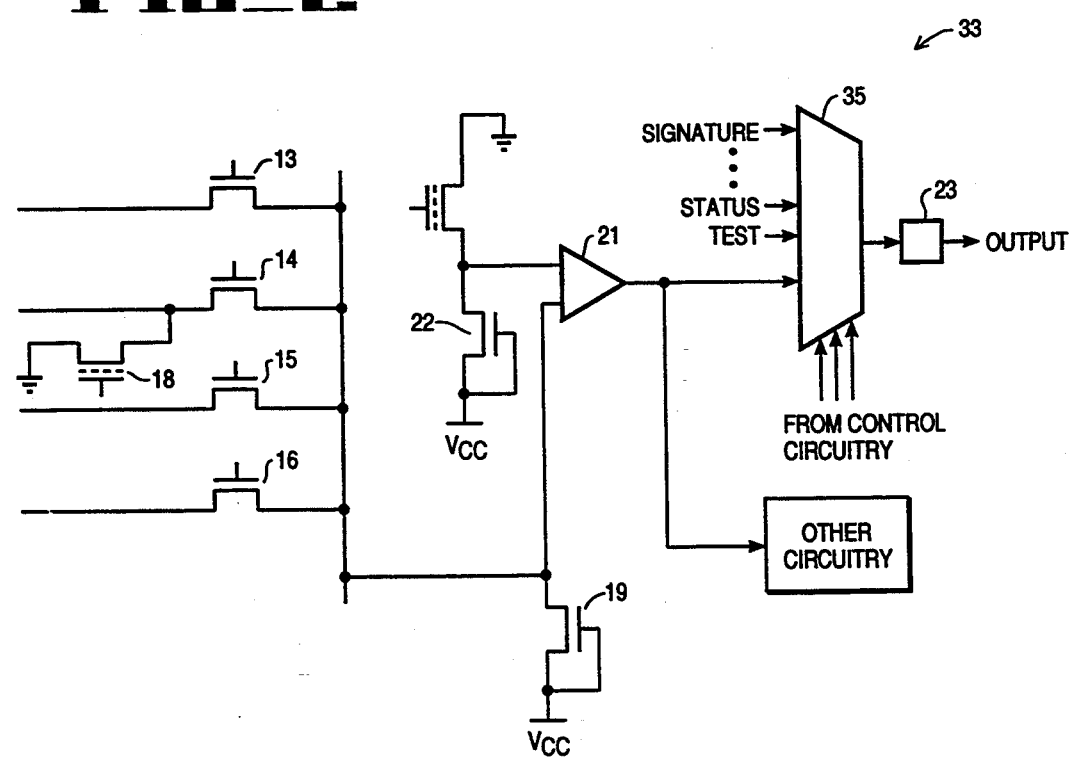

ARCHITECTURE FOR READING INFORMATION FROM A MEMORY ARRAY

This is a continuation of application Ser. No. 08/092,545, filed Jul. 16, 1993, abandoned, which is a continuation of application Ser. No. 07/654,383, filed Feb. 11, 1991, abandoned.

BACKGROUND OF THE INVENTION

1. Field Of The Invention

This invention relates to memory arrays and, more particularly, to an architecture for transferring a plurality of different types of information from a memory array.

2. History Of The Prior Art

Memory arrays are made up of a large plurality of memory devices each capable of storing some form of representation of a one or a zero. Typically the memory devices are arranged in rows and columns so that the state of any devices may be selected to be read or written by control circuitry for selecting a row and a column. In the case of a read operation, the binary condition of the memory device which is being read is presented at the input of a sense amplifier. The sense amplifier is essentially an operational amplifier which amplifies an analog signal presented at its input and converts that signal so that it is presented at the output in a useful digital form.

In a typical prior art memory array, there are often other signals than the data being read from the memory devices at the row and column intersections of the memory array which must be transferred to external circuitry. For example, the name of the manufacturer of the memory array and the particular array identification (the part signature) are typically available through the control circuitry of the array. The results of tests conducted using test registers are other data which are available. Most often, these signals are digital in form. The prior art method of transferring these other signals (referred to hereinafter as extra signals) out of the memory device provided for presenting the extra signals to the sense amplifiers which transfer the data signals from the columns of the memory array so that the extra signals traversed the same path as the data stored in the array.

This handling of the extra signals from the array created at least three problems. First, it required that the digital control signals be first converted into analog signals in order to pass through the sense amplifiers at the array output and then be changed back into digital signals by the sense amplifiers for transmission to the outside world. This, in itself, is a waste where the signal is initially digital in form. Second, the circuitry for transferring the extra signals to the sense amplifiers was often incidental to the purpose of the memory array and was designed as an after thought. Without the planning used in designing the remainder of the array and control circuitry, the circuitry for furnishing these extra signals often generated unexpected parasitic capacitance at a point least able to cope with such capacitance. The overall result was to slow the operation of the memory array.

Third, it prevents any other array access from occurring while these extra signal are being read. In prior art circuits, this was not an issue. However, as the control circuitry for memory arrays has become capable of handling more functions, it has become necessary to be able to read or program the array while furnishing output information containing status information at the pin level. It is not possible for the sensing circuits to do both of these operations at the same time.

SUMMARY OF THE INVENTION

It is, therefore, an object of the present invention to decrease the parasitic capacitance affecting a memory array and to allow accessing of the array internally while bringing other signals to the output pins.

It is another object of the present invention to provide a new architecture for transferring signals other than the data stored at row and column positions in a memory array from the memory device.

These and other objects of the present invention are realized in a memory array having a plurality of rows and columns of memory devices for storing binary conditions, means for selecting particular memory devices, a sense amplifier for transferring indications of the conditions of selected memory devices, and means for generating signals indicative of conditions other than the state of the memory devices, the improvement comprising a multiplexor, the multiplexor being arranged to accept as input the output of the sense amplifier and the signals indicative of conditions other than the state of the memory devices, the multiplexor and the means for generating signals indicative of conditions other than the state of the memory devices being positioned in a manner that parasitic capacitance affecting the input to the sense amplifier is not created. In a preferred embodiment of the invention, the output of the sense amplifier may also be connected to other internal circuits.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram of a typical circuit of the prior art for transferring control and similar signals from a memory array.

FIG. 2 is a block diagram of a circuit of the present invention for transferring control and similar signals from a memory array.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to apparatus for operating a computer in processing electrical or other (e.g. mechanical, chemical) physical signals to generate other desired physical signals.

DETAILED DESCRIPTION OF THE INVENTION

FIG. 1 illustrates a prior art arrangement 10 for deriving from a memory array signals other than those signals representing the data stored at the intersections of the rows and columns defining the memory array. Such signals are typically signals indicating the signature of the particular part which constitutes the memory array. Such a signature has been a standard output provided by memory arrays for some time now. Other signals which may be furnished from the array are signals indicating the condition of status registers and signals indicating the condition of test registers used to ascertain the operating condition of the array. The number of such signals which are provided by control circuitry associated with the array increases as the speed and facility of the memory array increases. This is particularly true of memory arrays of EEPROMs and similar circuits which provide programmable long term memory and have associated control circuitry for accomplishing the programming.

In FIG. 1, a memory array 12 is illustrated in block diagram form. The array 12 is generally comprised of a plurality of rows and columns of memory devices which are not illustrated in FIG. 1. The state of each of these memory devices may be interrogated by selecting a particular column and a particular row of the array through row select devices and column select devices. These column select devices are represented by four individual transistors 13-16 illustrated in the Figure. Although only four devices are illustrated, typically, there will be one column select device for each column of devices in the memory array. The row select devices are not illustrated in the Figure but as with the column select devices, one row select device is typically provided for each row of the memory array. A single transistor 18 illustrates a memory device selected by the intersection of row and column selection devices.

The drain terminals of the column select devices 13-16 are connected to a drain bias arrangement 19 which is generally a resistive load. The voltages at the drain terminals of the devices 13-16 are provided as input signals to a sense amplifier 21. The sense amplifier 21 also receives a reference input signal from a source of current 22.

If, when it is interrogated, the transistor 18 is in a conducting state, a current flows to ground through the device 18 providing a first voltage at the drain terminals of the devices 13-16. If the transistor 18 is not conducting, current does not flow from the drain bias arrangement, and a second voltage is provided to the sense amplifier 21. In this manner, two conditions are furnished to the sense amplifier 21. A sense amplifier 21 is necessary in the circuit because the values sensed in the array are quite small (a few hundred millivolts) and must be amplified in order to be used.

In order to transfer signals others than those stored in the memory array to the outside world, it has been typical to connect a source of those signals to the array input to each sense amplifier 21. For example, an arrangement for providing a signature of the memory array includes a pair of transistors 24 and 25 joined to the input to the sense amplifier 21. The device 24 is connected to a device 26 which has its gate terminal connected to Vcc. This arrangement allows current to flow from the current source which is drain bias arrangement 19 and provides a voltage at the input to the sense amplifier 21. The device 25 is connected to a device 27 which has its gate terminal connected to ground. This arrangement provides a path through which no current flows. Switching the devices 24 and 25 on and off generates voltages at the input to the sense amplifier 21 which may be transmitted by an output amplifier 23 to indicate the signature of the part.

However, the provision of the devices 24 and 25 and their associated circuitry at the input to the sense amplifier 21 means that any parasitic capacitance generated by the circuitry involving those devices affects the output of the memory array at the very sensitive input to the sense amplifier 21. In general, any such parasitic capacitance slows the read operation of the memory array by increasing resistance/capacitance delays of the memory array output.

FIG. 2 illustrates a block diagram of an arrangement constructed in accordance with the present invention. The arrangement 33 illustrated includes a memory array represented by four column select transistors 13-16, a memory device 18, a drain bias 19, a sense amplifier 21, and an output amplifier 23. The arrangement 33, like the arrangement 10 illustrated in FIG. 1 has a number of extra signals which may be provided other than the condition of the memory devices of the array. In contrast to the arrangement of FIG. 1, however, the arrangement 33 provides these extra signals to the outside world through a multiplexor 35 which is arranged to accept the output of the sense amplifier 21 as a single one of a plurality of possible inputs.

For example, the multiplexor 35 in a preferred embodiment of the invention may comprise an eight-to-one multiplexor which is connected to handle the output of the sense amplifier 21 when the memory array is to be read as a single one of the eight inputs available. In the preferred embodiment of the invention, three of the other inputs are used for providing three different types of signature signals to the output of the multiplexor, one input is used to transfer a signal indicating the status of write control circuitry associated with the memory array, and three lines are used for transferring data related to conditions of test registers within the control circuitry associated with the memory array and the results of tests conducted using those test registers.

The output of the multiplexor 35 is controlled by a number of signals from the control circuitry of the memory arrangement. These control signals select the output to be furnished by the multiplexor 35. Thus, in a normal read operation, the output of the memory devices in the array may be selected. Alternatively, one of the part signatures, a test result, or a status indication may be provided.

By placing a multiplexor at the output of the sense amplifier 21 and moving the circuits which provide the extra signals away from the input to the sense amplifier 21, circuitry which might otherwise create parasitic capacitances at the input to the sense amplifier 21 is eliminated. It will be understood by those skilled in the art that the circuitry used for generating the extra signals which are provided as inputs to the multiplexor 35 may be selectively arranged on the chip so that it has no capacitive effect on the sense amplifiers associated with the memory array.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. Output circuitry within an integrated circuit memory for coupling signals internal to the integrated circuit memory to external circuitry, the integrated circuit memory including a multiplicity of memory devices, and a source of digital signals separate from the memory devices, the output circuitry comprising:
   a) a sense amplifier having an input coupled to a selected memory device of the memory devices, and an output for outputting a first digital signal representative of a state of the selected memory device; and
   b) a multiplexor including a first input, a second input, and an output coupled to the external circuitry, the first input being coupled to the output of the sense amplifier for receiving the first digital signal, and the second input being coupled to receive a second digital signal from the source of digital signals representative of information other than the state of the selected memory device, the multiplexor selecting one of the first input and the second input to couple to the output in response to a control signal, the first input of the multiplexor receiving only the first digital signal from the output of the sense amplifier.

2. The output circuitry of claim 1 wherein the second digital signal represents a signature of the integrated circuit memory.

3. The output circuitry of claim 1 wherein the second digital signal represents a test condition of the integrated circuit memory.

4. The output circuitry of claim 1 wherein the second digital signal represents a status condition of the integrated circuit memory.

* * * * *